(12) United States Patent
Coffin et al.

(10) Patent No.: US 6,462,271 B2
(45) Date of Patent: Oct. 8, 2002

(54) CAPPING STRUCTURE FOR ELECTRONICS PACKAGE UNDERGOING COMPRESSIVE SOCKET ACTUATION

(75) Inventors: Jeffrey T. Coffin, Pleasant Valley, NY (US); Michael J. Ellsworth, Jr., Lagrangeville, NY (US); Lewis S. Goldmann, Bedford, NY (US); John G. Torok, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/748,829

(22) Filed: Dec. 27, 2000

(65) Prior Publication Data

US 2002/0079117 A1 Jun. 27, 2002

(51) Int. Cl.[7] .................................................. H05K 7/20
(52) U.S. Cl. ...................... 174/52.1; 361/707; 361/711; 361/714; 361/719
(58) Field of Search .......................... 174/52.1; 361/688, 361/704, 707, 708, 709, 710, 711, 712, 714, 717, 718, 719, 722; 257/704, 710, 712, 713, 718, 719

(56) References Cited

U.S. PATENT DOCUMENTS

| 5,471,027 | A | * | 11/1995 | Call et al. ................. 219/85.13 |
| 5,473,510 | A | * | 12/1995 | Dozier, II ...................... 361/719 |
| 5,737,187 | A |   | 4/1998  | Nguyen et al. .............. 361/704 |
| 5,777,847 | A |   | 7/1998  | Tokuno et al. ............... 361/705 |
| 5,821,161 | A | * | 10/1998 | Covell et al. ................ 257/704 |
| 5,889,323 | A | * | 3/1999  | Tachibana .................... 257/678 |
| 5,901,039 | A |   | 5/1999  | Dehaine et al. ............. 361/704 |
| 5,950,073 | A |   | 9/1999  | Griffin, IV et al. ......... 438/119 |
| 5,990,566 | A |   | 11/1999 | Farnworth et al. .......... 257/783 |
| 6,049,464 | A |   | 4/2000  | Garbelli et al. ............. 361/760 |
| 6,055,159 | A | * | 4/2000  | Sun .............................. 361/704 |
| 6,222,263 | B1 | * | 4/2001  | Sherif et al. ................. 257/704 |

FOREIGN PATENT DOCUMENTS

JP 4-357857 10/1992

* cited by examiner

*Primary Examiner*—Dean A. Reichard
*Assistant Examiner*—Carmelo Oliva
(74) *Attorney, Agent, or Firm*—Andrew J. Wojnicki, Jr., Esq.; Kevin P. Radigan, Esq.; Heslin Rothenberg Farley & Mesiti P.C.

(57) ABSTRACT

A capping structure and capping method are presented for an electronics package having a substrate and one or more electronics devices disposed on the substrate. The capping structure includes a capping plate sized to cover the electronics device(s) disposed on the substrate, and two or more force transfer pins. The force transfer pins are disposed between the capping plate and the substrate so that when a force is applied to the capping plate or the substrate, the force is transferred therebetween via the force transfer pins. Various capping plate and pin configurations are presented.

32 Claims, 5 Drawing Sheets fig. 1A fig. 1B

CAPPING STRUCTURE FOR ELECTRONICS PACKAGE UNDERGOING COMPRESSIVE SOCKET ACTUATION

TECHNICAL FIELD

The present invention relates in general to packaging and assembly of electronics devices, and more particularly, to a capping structure and capping method for an electronics package, such as a multi-component module, to undergo compressive socket actuation for connection thereof to an electronics board.

BACKGROUND OF THE INVENTION

The ever present quest for higher performing and lower cost digital electronics has resulted in the formation of multi-component modules where different types of electronic components are mounted to a common substrate. One example of a multi-component module would be a substrate having an unpackaged integrated circuit chip, such as an application specific integrated circuit (ASIC), as well as one or more packaged memory modules, and decoupling capacitors.

Normally, it is required that a heat sink be thermally connected to an ASIC chip in view of its high power level, and therefore high thermal dissipation. Traditionally, an electronics package to be cooled would be capped using a perimeter capping structure, with a thermal grease used to thermally connect the components to the cap, and a heat sink applied to an exposed planar surface of the cap.

A problem arises, however, where there is insufficient room to join a conventional, perimeter capping structure to the substrate of an electronics package. This problem is compounded when compressive socket actuation is to be employed to electrically connect the electronics package to an electronics board. Compressive socket actuation is a technique for mounting, for example, an electronics package onto a printed circuit board wherein the electronics package undergoes a compressive force to achieve compressive socket actuation and thereby establish electrical connection between wiring on the substrate of the package and wiring on the printed circuit board.

SUMMARY OF THE INVENTION

With the above background, this invention results from a recognition of a need for enhanced capping structures and capping methods for use with multi-component modules which are to undergo compressive socket actuation (e.g., for connection thereof to an electronics board), particularly where conventional, perimeter capping structures are unable to be used.

Briefly summarized, present herein in one aspect is a capping structure for an electronics package having a substrate and at least one electronics device disposed thereon. The capping structure includes a capping plate and n force transfer pins, wherein n>1. The capping plate is sized to at least partially cover the at least one electronics device disposed on the substrate. The n force transfer pins are disposed between the capping plate and the substrate to mechanically couple the capping plate to the substrate so that when a force is applied to the capping plate or the substrate, the force is at least partially transferred to the substrate or the capping plate, respectively, via the n force transfer pins.

In another aspect, a method of capping an electronics package having a substrate and at least one electronics device disposed thereon is provided. The method includes: providing a capping plate sized to at least partially cover the at least one electronics device disposed on the substrate; providing n force transfer pins, wherein n>1; and disposing the n force transfer pins between the capping plate and the substrate, wherein the n force transfer pins mechanically couple the capping plate to the substrate so that when a force is applied to the capping plate or the substrate, the force is at least partially transferred to the substrate or the capping plate, respectively, via the n force transfer pins.

To restate, provided herein is an enhanced capping structure and capping method, particularly useful for a multi-component electronics package to undergo compressive socket actuation. For a compression socket to function, a compressive load must be applied between the electronics package and the electronics board to which it is to be electrically connected. In a conventional module application, this load is transferred through the module cap along the periphery of the substrate. Unfortunately, conventional module caps limit the area available on the substrate for electronic components. In view of this, describe herein is a capping structure which allows greater utilization of the substrate's upper surface for supporting of electronic components, and still provides the necessary means to transfer load to the substrate from the capping structure for compressive socket actuation.

Additional features and advantages are realized through the techniques of the present invention. Other embodiments and aspects of the invention are described in detail herein and are considered a part of the claimed invention.

BRIEF DESCRIPTION OF THE DRAWINGS

The above-described objects, advantages and features of the present invention, as well as others, will be more readily understood from the following detailed description of certain preferred embodiments of the invention, when considered in conjunction with the accompanying drawings in which.

BEST MODE FOR CARRYING OUT THE INVENTION

Figure 1A:
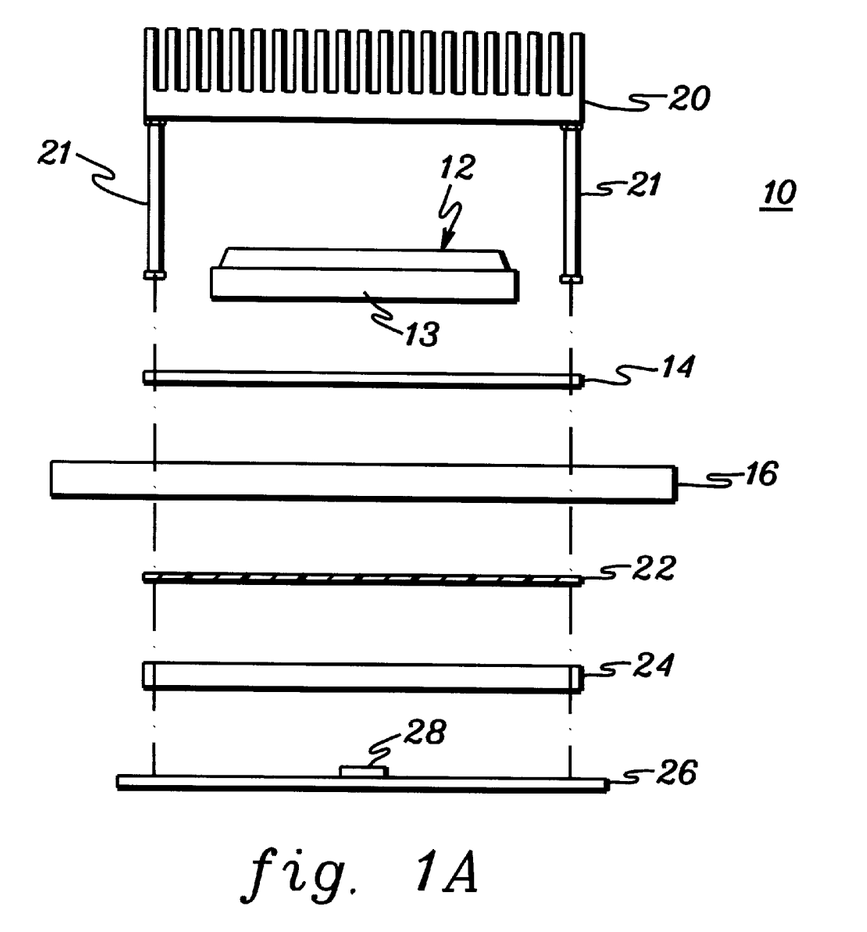
FIG. 1A is an exploded elevational view of one embodiment of an electronics package, compression socket, electronics board, and compressive heat sink assembly, wherein the electronics package is to employ a capping structure in accordance with the principles of the present invention.
Figure 1B:
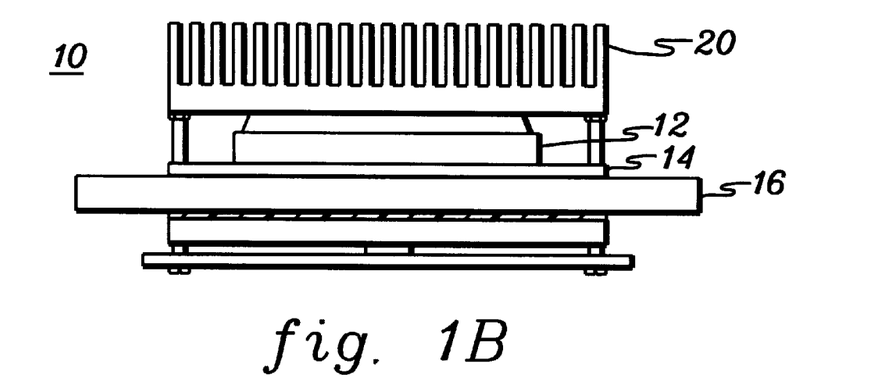
FIG. 1B is an assembled elevational view of the structures of FIG. 1A.

Today's high input/output (I/O) electronic modules are departing from standard soldered electrical connection to an electronics board in favor of compression loading being used to "attach" an electronics module to the board via a compression socket. An example of a compressive actuation system is depicted in FIGS. 1A & 1B. This system, generally denoted 10, establishes a compressive load between an electronics package 12, a socket 14 and an electronics board 16 to make the appropriate electrical connection therebetween. Socket 14 may comprise any one of a variety of compression sockets commercially available today. For example, Cinch Connector Division of Labinal Components & Systems, Inc. of Lombard, Ill. markets such an interconnect product as a CIN::APSE High-Speed Interconnect Socket. Another example is a chip-to-board MPI/LGA socket marketed by Thomas & Betts Corp. of Memphis, Tenn. Either of these sockets could be employed to connect, for example, a high I/O microprocessor/ASIC package to a printed circuit board.

System 10 further includes a heat sink 20 having actuation pins 21 which couple to a spring plate 26 on an undersurface of electronics board 16. Spring plate 26 is spaced from electronics board 16 via an insulator 22 and a backing plate 24, for example, comprising stainless steel. Heat sink 20 is shown in this example to comprise an air cooled, fin-type heat sink. In addition, heat sink 20 has a larger contact surface than electronics package 12, which facilitates dissipation of thermal energy extracted from electronics package 12.

The force required to load the electronics package originates with the action of spring plate 26 pulling the heat sink down on top of the electronics package via pins 21. For example, spring plate 26 may include a setscrew 28 which allows adjustment of the amount of force being applied within the assembly. For an electronics package with a peripheral capping structure, the applied force would be transmitted from heat sink 20 to the substrate 13 of electronics package 12 along the periphery of the substrate, i.e., where the cap attaches to the substrate.

Figure 2A:
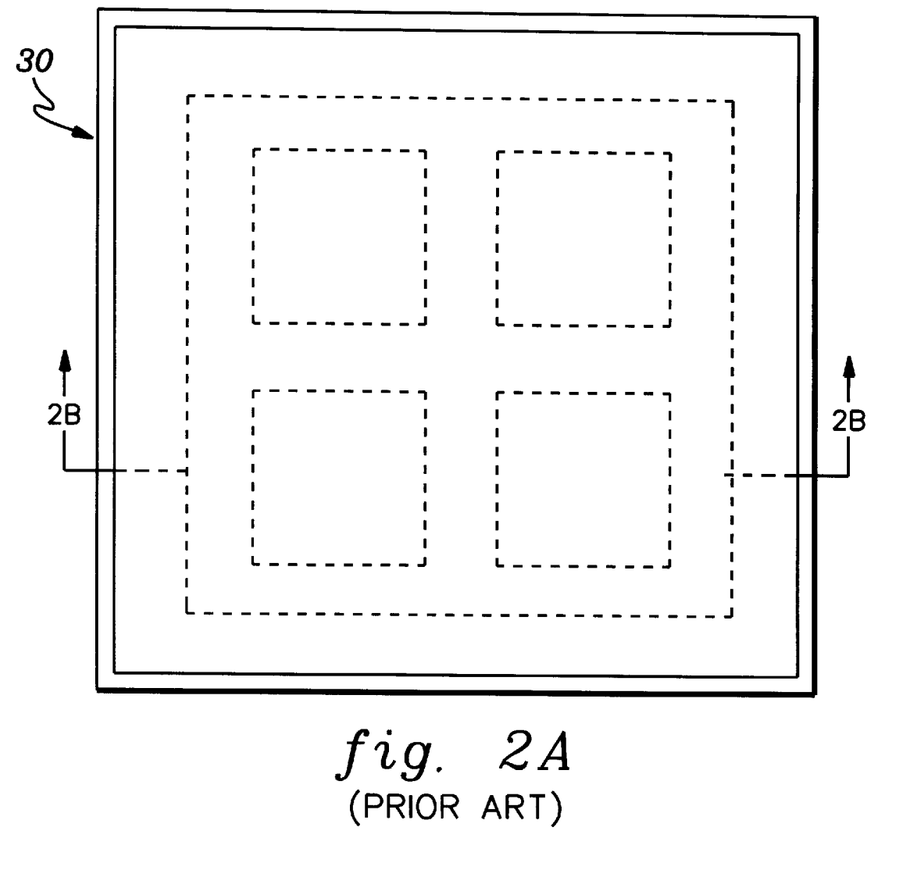
FIG. 2A is a plan view of one embodiment of an electronics package with a conventional, perimeter capping structure.
Figure 2B:
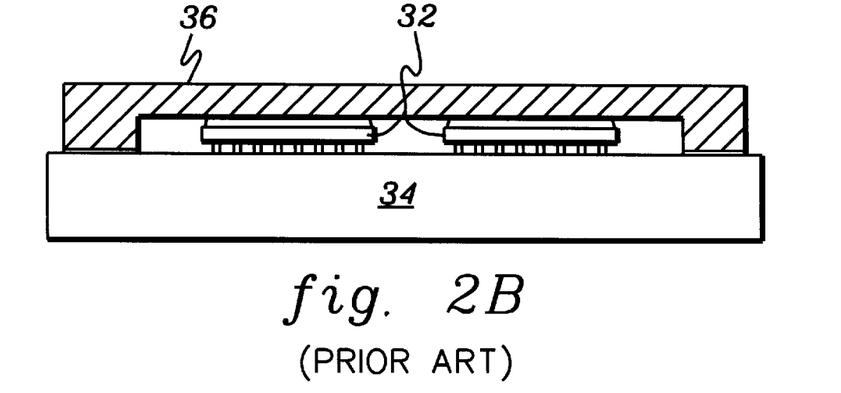
FIG. 2B is a cross-sectional elevational view of FIG. 2A taken along line 2B—2B.

FIGS. 2A & 2B depict one embodiment of an electronics package 30 having an conventional, peripheral capping structure 36. As shown in FIG. 2B, capping structure 36 contacts substrate 34 only around a periphery of the package. Within the package, integrated circuit chips or modules 32 are arrayed on substrate 34. The difficulty with this capping approach is that significant real estate must be provided on the substrate as shown in FIG. 2A to allow for the peripheral contact of the capping structure to the substrate.

Figure 3:
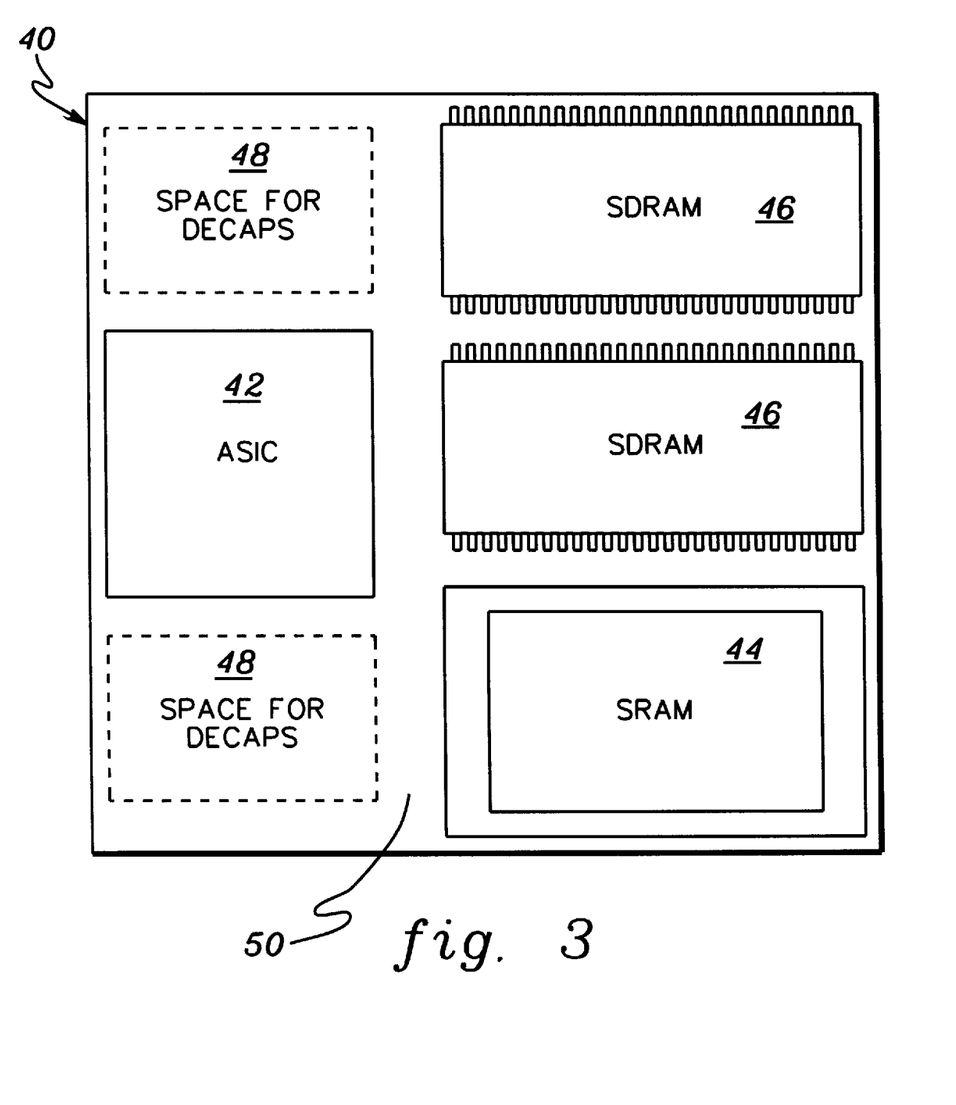
FIG. 3 is a top plan view of one embodiment of a multi-component electronics package to which a capping plate is to be attached in accordance with the principles of the present invention.

FIG. 3 depicts another embodiment of an electronics package, generally denoted 40. Package 40 is a multi-component electronics package (or module) wherein both an unpackaged silicon circuit chip and packaged modules are mounted to a common substrate 50. The components of package 40 differ both in component height and power dissipation. Component heights can vary by as much as 1.5 mm. In this embodiment, the electronics package includes an integrated circuit chip 42, such as an ASIC, and packaged memory chips, such as SRAM 44 and SDRAM 46. Space 48 is also allotted within the package for decoupling capacitors.

A problem addressed by the present invention is that there is insufficient room along the perimeter of electronics package 40 to employ a conventional, peripheral capping structure (such as structure 36 depicted in FIGS. 2A & 2B). A capping structure is necessary, however, since for example a heat sink is to be thermally connected to the electronic devices disposed within the package, and particularly, the ASIC chip due to its high power level. One conventional cooling approach with such an electronics package might be to connect separate heat transfer surfaces directly to the individual components within the package, a process called direct lid attach (DLA).

Several problems arise, however, when a direct lid attached module is considered for a compression assembly such as depicted in FIGS. 1A & 1B. These problems all stem from there being no separate mechanical support between the plate and the substrate, e.g., around the module's periphery. First, the actuation force will have to be transferred through the electronic components themselves, which can cause damage to the components. Second, bending moments will be formed within the DLA structure that may fracture the joints made between component(s) and the DLA structure. And finally, the actuation forces that are directed through the center of the module can cause excessive substrate flexure that might either crack the substrate or result in prohibitively reduced contact pressure for I/O near the substrate's periphery. This is particularly true for single chip modules.

Compressive socket manufacturers typically specify a minimum force per contact required to make a reliable electrical connection. A typical value for this minimum force is 70 grams force per contact. Design loads, however, can be as high as 100 grams force per contact to assure contact is not broken during shock and vibration. A 42.5 mm module with an excess of 1000 contacts would therefore require a compressive load of 240 lbf (pounds force) to assure electrical contact.

Figure 4:
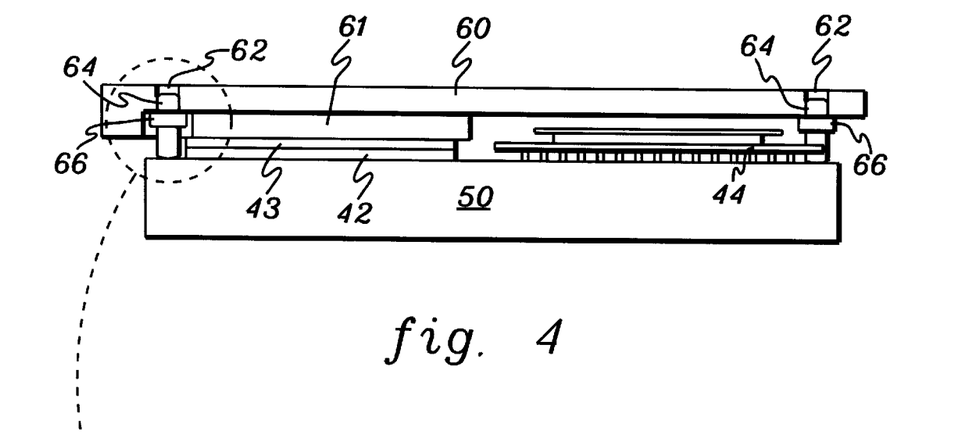
FIG. 4 is an elevational view of one embodiment of a capping structure in accordance with the principles of the present invention, shown with the multi-component electronics package of FIG. 3.
Figure 4A:
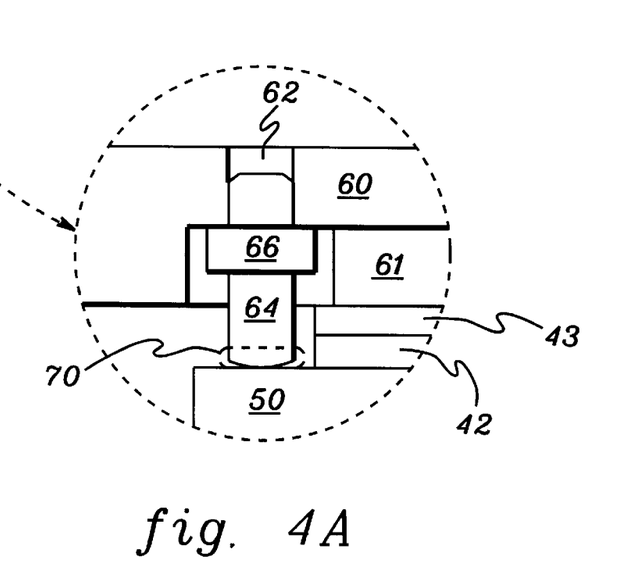
FIG. 4A is a partial enlarged view of one force transfer pin of FIG. 4.
Figure 5:
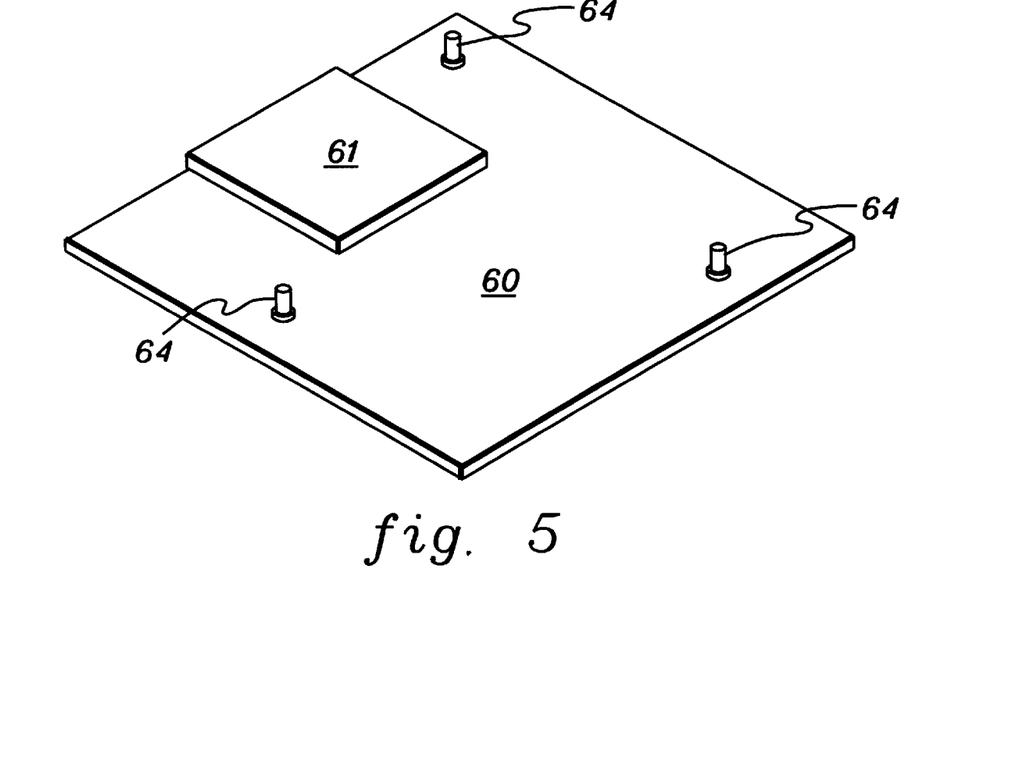
FIG. 5 is a perspective view of one embodiment of the lower surface of a capping plate with force transfer pins in accordance with the principles of the present invention.

FIGS. 4 & 4A depict an elevational view of an electronics package (such a package 40 of FIG. 3), having a capping structure in accordance with the principles of the present invention. This capping structure includes a capping plate 60 having a tiered undersurface, which in this example is desirable to satisfy the specific nonuniform component heights of components within electronics package 40 of FIG. 3. The tiered lower surface of capping plate 60 is best shown in FIG. 5 where (in this example) a pedestal 61 is disposed and sized to align over ASIC chip 42 (FIG. 3) to facilitate good thermal connection between the chip and the capping plate. The capping plate is assumed to be thermally conductive, and may be manufactured (for example) of copper or aluminum.

In the embodiment of FIGS. 4 & 4A, three force transfer pins 64 are employed to mechanically couple the capping plate to the substrate 50. In other embodiments, particularly when using direct lid attached to one or more components of the electronics package, it may be possible to use two force transfer pins or more than three. Available space on the module will usually dictate final placement of the force transfer pins, but the pins should be disposed as close as possible to an isosceles triangle to provide the greatest structural stability, i.e., assuming that three force transfer pins are employed.

Further, those skilled in the art should note that the embodiment of capping plate 60 depicted herein is only one example of the concepts presented. A capping plate in accordance with this invention may have a flat undersurface, or may have a multitude of tiers depending upon the height of the various components within the electronics package to which the capping structure is to be applied.

In the embodiment of FIGS. 4 & 4A, each force transfer pin 64 is interference fitted within a respective opening 62 in capping plate 60. Further, each pin includes a radially extending region or shoulder 66 which serves in part to properly position the pin relative to the plate 60. Once embedded within plate 60, pins 64 serve multiple functions. For example, the pins establish a plane of contact with the substrate; and the pins transfer force that is applied to plate 60 to substrate 50. Pins 64 are sized so that a plane of contact is created for plate 60 with gaps between the various components of the multi-component package and the plate. These closely controlled gaps may be desirable to facilitate heat transfer. For example, an adhesive (e.g., epoxy), elastomer, solder or mechanical joint could be made within one or more of these gaps to provide a relatively low thermal resistance pathway for heat transfer from the respective component to the capping plate, while also helping to maintain the capping plate in position so that the assembled multi-component package may be handled as a field replaceable unit (FRU). However, those skilled in the art should recognize that any applied compressive force is principally and evenly transferred through the force transfer pins, not due to any thermal coupling between one or more components of the electronics package and the capping plate.

FIG. 4A depicts in greater detail one embodiment of force transfer pin 64 in accordance with this invention. As shown, pin 64 has a spherical crown 70 at one end, which is in physical contact with substrate 50. The crown is desirable to minimize Hertzian stresses in the substrate that result from the contact. The radius of curvature required can be readily determined by one skilled in the art using stress analysis techniques.

In the embodiment of FIGS. 4 & 4A, a thermal interface 43 is disposed between ASIC 42 and pedestal 61 on the underside of capping plate 60. This thermal interface may comprise an adhesive or elastomer joint, which also functions to hold the capping plate in position.

One fabrication approach for producing the assembly of FIGS. 4 & 4A would be as follows: After providing a capping plate 60 with openings 62 formed therein, the force transfer pins (three in this example) are each press fitted into a respective opening in the plate. In one embodiment, the force transfer pins are identically constructed to close tolerances.

The surface of one or more electronic component to be attached to the capping structure is next cleaned, for example, using an alcohol cleanser. In this example, the surface to be cleaned comprises an upper surface of ASIC 42. An elastomer or adhesive (e.g., epoxy) is then deposited on the upper surface of ASIC 42 and, if required for curing, the assembled electronics package is taken through an elevated temperature for a period of time. The capping structure is then appropriately positioned over the multi-component package so that the force transfer pins come down and rest on the upper surface of substrate 50 in the intended locations. In this example, the capping plate is positioned so that the crowned surface of each pin directly contacts the substrate. In one embodiment, one or more of the force transfer pins may be disposed between adjacent components of the multi-component package.

Figure 6:
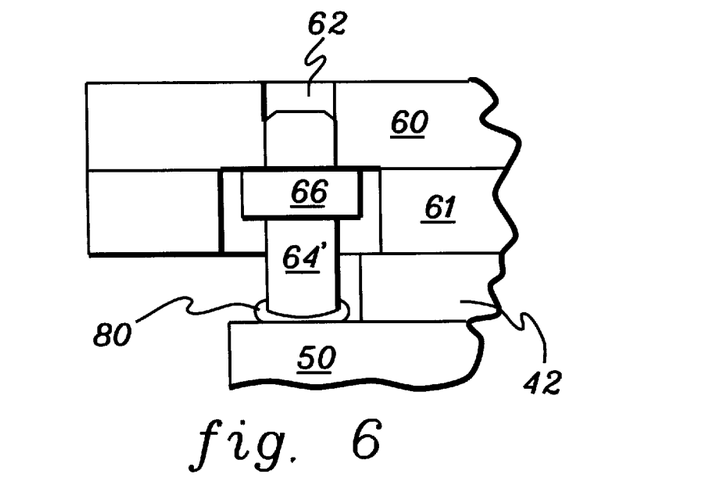
FIG. 6 is an partial enlarged view of an alternate embodiment of a capping structure in accordance with the present invention.

An alternate embodiment of a capping structure in accordance with the present invention is depicted in FIG. 6. In order to maximize heat transfer from a given component of the multi-component package, it may be desirable to place the capping plate substantially in direct contact with one or more bare integrated circuit chips, such as ASIC 42 of FIG. 3. This can be accomplished by using a direct lid attach (DLA) process. In the direct lid attach process, a thin elastomer or adhesive (for example, 0.5 mil.) (not shown) may be disposed above the chip to physically connect the chip to the undersurface of the capping plate.

In the embodiment of FIGS. 4 & 4A, a plane is established by the three pins being identically sized and in direct physical contact with the substrate. Therefore, the gaps above the components within the electronics package and the undersurface of the capping plate take up assembly tolerances, thus minimizing the nominal thickness of the gap. In the alternative embodiment of FIG. 6, tolerances are transferred to the pins themselves by establishing the plane of contact with a critical component(s) in question, for example, chip 42. The force transfer pins are designed in this embodiment to reside above the substrate a distance sufficient to absorb the assembly tolerances. For example, the pins may sit in a small amount of epoxy or elastomer, so that when the epoxy or elastomer is cured, compressive loads may still be transferred from, for example, a heat sink assembly, through the capping plate to the substrate of the multi-component package via the pins.

Fabrication of the structure of FIG. 6 can be accomplished by interference fitting the respective force transfer pins 64' into their corresponding openings 62 in capping plate 60. Pin shoulders 66 again facilitate proper positioning of the pins. The surface of the component to which the capping structure is to be DLA connected is cleaned, and an elastomer or adhesive is applied to directly attach the capping plate to the module component, i.e., for example, ASIC 42. An adhesive is then deposited on substrate 50 in locations where the force transfer pins are to align. The capping structure is appropriately placed over the multi-component package so that the capping plate comes to rest on the appropriate electronic component(s). At this point, the ends of the force transfer pins are suspended in the adhesive disposed on the substrate. The adhesive/elastomer is then cured by, for example, taking the assembly through an elevated temperature for a predefined period of time. This results in the pins being mechanically coupled to the substrate across the cured epoxy 80.

Those skilled in the art will note from the above discussion that an enhanced capping structure and capping method are provided herein which allow a capping plate to be mechanically connected to a substrate of a multi-component electronics package without the use of a conventional, peripheral cap structure. The capping structures disclosed herein allow greater utilization of the substrate's upper surface for supporting electronic components, yet still provides the necessary means to transfer load to the substrate from the capping plate, for example, for compressive socket actuation without relying on force transfer through direct connection to one or more components of the electronics package.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A capping structure for an electronics package having a substrate and at least one electronics device disposed thereon, the capping structure comprising:

a capping plate sized to at least partially cover the at least one electronics device disposed on the substrate;

n force transfer pins disposed between the capping plate and the substrate, wherein n>1; and wherein the n force transfer pins mechanically couple the capping plate to the substrate so that when a force is applied to the capping plate or the substrate, the force is principally transferred to the substrate or the capping plate, respectively, via the n force transfer pins.

2. The capping structure of claim 1, wherein the force is completely transferred to the substrate or the capping plate, respectively, via the n force transfer pins.

3. The capping structure of claim 1, wherein each force transfer pin of tie n force transfer pins has a lower crowned surface in direct physical contact with an upper surface of the substrate.

4. The capping structure of claim 1, wherein a cured adhesive or elastomer material is disposed between each force transfer pin and an upper surface of the substrate so that each force transfer pin is spaced from the upper surface of the substrate.

5. The capping structure of claim 1, wherein the n force transfer pins establish a gap between the at least one electronics device disposed on the substrate and the capping plate when the capping plate is positioned at least partially over the at least one electronics device.

6. The capping structure of claim 5, wherein the at least one electronics device comprises an integrated circuit chip, and wherein the capping plate is thermally conductive and the capping structure further includes a thermally conductive layer disposed in the gap between the integrated circuit chip and the capping plate to facilitate heat transfer from the integrated circuit chip to the capping plate.

7. The capping structure of claim 6, wherein the thermally conductive layer comprises one of an epoxy layer, an elastomer joint, or solder interface disposed between the capping plate and the integrated circuit chip positioned on the substrate.

8. The capping structure of claim 6, wherein the at least one electronics device comprises multiple electronics devices, and the integrated circuit chip comprises one electronics device of the multiple electronics devices, and wherein the multiple electronics devices further comprise an electronics module, the electronics module having a height above the substrate greater than a height of the integrated circuit chip, and wherein said n force transfer pins at least partially establish a height of said capping plate above said substrate, the capping plate height being greater than the height of the electronics module above the substrate.

9. The capping structure of claim 8, further comprising a pedestal on a lower surface of the capping plate the pedestal being located and sized to reside over the integrated circuit chip when the n force transfer pin mechanically couple to the substrate, wherein the pedestal provides a reduced gap between the integrated circuit chip and the lower surface of the capping plate to facilitate heat transfer from the integrated circuit chip to the capping plate.

10. The capping structure of claim 8, further comprising at least one pedestal disposed on a lower surface of the capping plate, the at least one pedestal being positioned and to size to align above at least one electronics device of the multiple electronics devices disposed on the substrate when the n force transfer pins mechanically couple the capping plate to the substrate.

11. The capping structure of claim 10, wherein the pedestal is sized to directly contact the integrated circuit chip across a thin adhesive layer or an elastomer joint, the thin adhesive layer or elastomer joint having a thickness less than 1 mil.

12. The capping structure of claim 1, wherein the capping plate and the n force transfer pins are interference fitted together.

13. The capping structure of claim 12, wherein the n force transfer pins each include a shoulder, the shoulder facilitating proper positioning of the interference fitted pin relative to the capping plate, and transfer of the force between the capping plate and substrate.

14. The capping structure of claim 1, wherein n equals three and the three force transfer pins mechanically couple to the capping plate in a triangular pattern for stability of the capping plate relative to the substrate.

15. The capping structure of claim 1, wherein the at least one electronics device comprises multiple electronics devices arrayed on the substrate, and wherein at least one pin of the n force transfer pins is disposed between two adjacent electronics devices of the multiple electronics devices.

16. The capping structure of claim 15, wherein each pin of the n force transfer pins is disposed between a different pair of adjacent electronics devices of the multiple electronics devices arrayed on the substrate.

17. The capping structure of claim 15, wherein n equals three and the three force transfer pins mechanically couple to the capping plate in a triangular pattern for stability of the capping plate relative to the substrate.

18. The capping structure of claim 15, wherein the multiple electronics devices comprise multiple different types of electronics devices arrayed on the substrate, said multiple different types of electronic devices comprising at least some of an unpackaged integrated circuit chip, an electronics module, and a passive circuit component.

19. The capping structure of claim 1, further in combination with a heat sink assembly and a compression socket, and wherein the capping plate is thermally conductive, and the force is applied by the heat sink assembly physically coupling to an upper surface of the capping plate, the compression socket being disposed between an undersurface of the substrate and an electronics board to which the electronics package is to be electrically connected via actuation of the socket.

20. A capped electronics package comprising:
 a substrate;
 at least one electronics device disposed on an upper surface of the substrate; and
 a capping structure disposed above the substrate and covering the at least one electronics device, wherein the capping structure comprises:
  a capping plate sized to cover the at least one electronics devices disposed on the substrate;
  n force transfer pins disposed between the capping plate and the substrate, wherein n>1; and
  wherein the n force transfer pins mechanically couple the capping plate to the substrate so that when a force is applied to the capping plate or the substrate, the force is principally transferred to the substrate or the capping plate, respectively, via the n force transfer pins.

21. The capped electronics package of claim 20, further in combination with a heat sink assembly and a compression socket for connecting the capped electronics package to an electronics board, wherein the electronics package is disposed between a heat sink of the heat sink assembly and the compression socket, and the compression socket is disposed between the capped electronics package and the electronics board, wherein a compressive force imparted to the capped electronics package by the heat sink assembly electrically connects the capped electronics package to the electronics board via actuation of the compression socket.

22. A method of capping an electronics package having a substrate and at least one electronics device disposed thereon, the method comprising:

providing a capping plate sized to at least partially cover the at least one electronics device disposed on the substrate;

providing n force transfer pins, wherein n>1; and disposing the n force transfer pins between the capping plate and the substrate, wherein the n force transfer pins mechanically couple the capping plate to the substrate so that when a force is applied to the capping plate or the substrate, the force is principally transferred to the substrate or the capping plate, respectively, via the n force transfer pins.

23. The method of claim 22, wherein the capping plate is thermally conductive, and wherein the disposing comprises providing a gap between the at least one electronics device disposed on the substrate and a lower surface of the capping plate, and disposing a thermally conductive material in the gap to facilitate heat transfer from the electronics device to the capping plate.

24. The method of claim 22, wherein the disposing comprises interference fitting the n force transfer pins into respective holes in the capping plate and positioning the capping plate above the substrate with the n force transfer pins aligned over the substrate and mechanically coupling thereto.

25. The method of claim 24, wherein the disposing further comprises providing a cured adhesive joint between each force transfer pin of the n force transfer pins and the substrate.

26. The method of claim 24, wherein the providing n force transfer pins comprises providing each force transfer pin with a lower crowned surface, and wherein said disposing comprises physically contacting the lower crowned surface of each force transfer pin to an upper surface of the substrate.

27. The method of claim 26, wherein the providing n force transfer pins comprises providing three force transfer pins, and the disposing comprises interference fitting the three force transfer pins to the capping plate in a triangular pattern for stability of the capping plate relative to the substrate.

28. The method of claim 22, wherein the at least one electronics device comprises multiple electronics devices, and wherein one electronics device of the multiple electronics devices comprises an integrated circuit chip, and wherein the providing of the capping plate further comprises providing a pedestal on a lower surface of the capping plate, the pedestal being sized and positioned to align to the integrated circuit chip when the capping plate is disposed above the substrate with the n force transfer pins positioned therebetween, wherein the pedestal facilitates heat transfer between the integrated circuit chip and the capping plate.

29. The method of claim 28, further comprising sizing the pedestal and the n force transfer pins so that the pedestal directly contacts the integrated circuit chip across a thin adhesive layer or an elastomer joint, the thin adhesive layer or elastomer joint having a thickness of less than 1 mil.

30. The method of claim 22, further comprising disposing a thermally conductive layer between the at least one electronics device and a lower surface of the capping plate to establish a direct thermal connection between the at least one electronics device and the capping plate, wherein the n force transfer pins are manufactured and the thermally conductive layer is selected so that the force is principally transferred between the capping plate and the substrate via the n force transfer pins.

31. The method of claim 22, wherein the providing n force transfer pins comprises providing each force transfer pin with a lower crowned surface, and wherein the disposing comprises physically contacting the lower crowned surface of each force transfer pin to an upper surface of the substrate.

32. The method of claim 22, wherein the at least one electronics device comprises multiple electronics devices, at least some electronics devices of said multiple electronics devices comprising different types of electronics devices so that said electronics package comprises a multi-component package, and wherein the method is further in combination with an assembly method, the assembly method comprising:

providing a heat sink in physical contact with an upper surface of the capping plate, and a compression socket disposed between a lower surface of the substrate and an electronics board to which the electronics package is to be electrically connected via actuation of the socket; and applying a compressive force between the heat sink and the electronics board to actuate the compressive socket and electrically connect the electronics package to the electronics board, wherein the compressive force is principally transferred between the capping plate and substrate via the n force transfer pins.

* * * * *